United States Patent
Sawada et al.

(10) Patent No.: US 11,425,235 B2
(45) Date of Patent: Aug. 23, 2022

(54) RADIO FREQUENCY MODULE AND COMMUNICATION DEVICE

(71) Applicant: Murata Manufacturing Co., Ltd., Nagaokakyo (JP)

(72) Inventors: Yoichi Sawada, Nagaokakyo (JP); Hiroshi Nishikawa, Nagaokakyo (JP); Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 147 days.

(21) Appl. No.: 17/078,107

(22) Filed: Oct. 23, 2020

(65) Prior Publication Data
US 2021/0136186 A1 May 6, 2021

(30) Foreign Application Priority Data
Oct. 30, 2019 (JP) .............................. JP2019-197686

(51) Int. Cl.
*H04M 1/02* (2006.01)
*H05K 7/20* (2006.01)

(52) U.S. Cl.
CPC .......... *H04M 1/026* (2013.01); *H05K 7/2039* (2013.01)

(58) Field of Classification Search
CPC ... H04M 1/026; H05K 7/2039; H01L 23/145; H01L 23/5383; H01L 23/15; H01L 23/4334; H01L 23/3675; H01L 23/49811; H01L 23/552
See application file for complete search history.

(56) References Cited

U.S. PATENT DOCUMENTS

| | | | | |
|---|---|---|---|---|
| 4,134,091 A | * | 1/1979 | Rogers | H01F 30/10 336/62 |
| 5,796,584 A | * | 8/1998 | Myrberg | H01L 23/4006 174/16.3 |
| 6,586,782 B1 | * | 7/2003 | Finlay | H01L 27/082 257/E29.189 |
| 2003/0085464 A1 | * | 5/2003 | Lang | H01L 23/50 257/E23.079 |
| 2011/0255850 A1 | * | 10/2011 | Dinh | H01L 23/552 396/176 |
| 2011/0294553 A1 | * | 12/2011 | Patil | H04B 1/525 455/571 |
| 2013/0048262 A1 | * | 2/2013 | Ofoma | H01L 23/36 165/185 |
| 2014/0078677 A1 | * | 3/2014 | Dolci | H01L 23/10 361/720 |

(Continued)

FOREIGN PATENT DOCUMENTS

JP 2011-40602 A 2/2011

*Primary Examiner* — Lewis G West
(74) *Attorney, Agent, or Firm* — Xsensus LLP

(57) ABSTRACT

A radio frequency module includes: a module substrate that includes a principal surface on which external-connection terminals are disposed; a power amplifier that is disposed on the principal surface of the module substrate and amplifies a radio frequency transmission signal; and a heat dissipator that dissipates heat of the power amplifier. The heat dissipator includes: a heat dissipation plate that covers a surface of the power amplifier which is opposite to a surface that faces the module substrate; and at least a first leg that extends from the heat dissipation portion toward the principal surface of the module substrate.

20 Claims, 8 Drawing Sheets

(56) References Cited

U.S. PATENT DOCUMENTS

| | | | | |
|---|---|---|---|---|
| 2015/0103491 A1* | 4/2015 | Ma | ............................ | H01L 24/49 |
| | | | | 29/840 |
| 2015/0364445 A1* | 12/2015 | Choi | ..................... | H01L 25/105 |
| | | | | 257/664 |
| 2016/0065144 A1* | 3/2016 | Jiang | ........................ | H01L 23/36 |
| | | | | 29/830 |
| 2017/0055341 A1* | 2/2017 | Ma | ........................ | H01L 23/3675 |
| 2020/0312736 A1* | 10/2020 | Singh | ................... | H01L 23/3675 |
| 2021/0136186 A1* | 5/2021 | Sawada | ................ | H01L 23/4334 |
| 2021/0203372 A1* | 7/2021 | Yoshida | ................. | H04B 1/006 |
| 2021/0288679 A1* | 9/2021 | Sawada | ............. | H01L 23/49811 |
| 2021/0288680 A1* | 9/2021 | Takahashi | ................. | H04B 1/04 |
| 2021/0306012 A1* | 9/2021 | Yamaguchi | ............. | H04B 1/006 |
| 2021/0336641 A1* | 10/2021 | Yamaguchi | ........... | H04B 1/1607 |
| 2021/0409062 A1* | 12/2021 | Matsumoto | ............. | H01L 25/18 |

* cited by examiner

RADIO FREQUENCY MODULE AND COMMUNICATION DEVICE

CROSS REFERENCE TO RELATED APPLICATION

The present application is based on and claims priority to Japanese Patent Application No. 2019-197686 filed on Oct. 30, 2019. The entire disclosure of the above-identified application, including the specification, drawings and claims is incorporated herein by reference in its entirety.

TECHNICAL FIELD

The present disclosure relates a radio frequency module and a communication device.

BACKGROUND

A mobile communication device such as a mobile phone includes a power amplifier that amplifies a radio frequency transmission signal.

Japanese Unexamined Patent Application Publication No. 2011-40602 discloses a semiconductor module in which a semiconductor chip included in a power amplifier is placed over the undersurface of a wiring substrate.

SUMMARY

Technical Problems

However, as recognized by the present inventor, the semiconductor module disclosed in Japanese Unexamined Patent Application Publication No. 2011-40602 has a problem that the heat dissipation of the power amplifier is not sufficiently high.

In view of the above, the present disclosure aims to provide a radio frequency module capable of improving the heat dissipation of a power amplifier disposed on the lower surface (a principal surface on which external-connection terminals are disposed) of a substrate, and a communication device including such radio frequency module.

Solutions

The radio frequency module according to an aspect of the present disclosure includes: a substrate that includes a first principal surface on which external-connection terminals are disposed; a power amplifier that is disposed on the first principal surface and amplifies a radio frequency transmission signal; and a heat dissipator that dissipates heat of the power amplifier. Here, the heat dissipator includes: a heat dissipation plate that covers a surface of the power amplifier which is opposite to a surface that faces the substrate; and at least a first leg that extends from the heat dissipation portion toward the first principal surface.

Advantageous Effects

The present disclosure is capable of improving the heat dissipation of the power amplifier that is disposed on the lower surface of the substrate.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT

Figure 1:
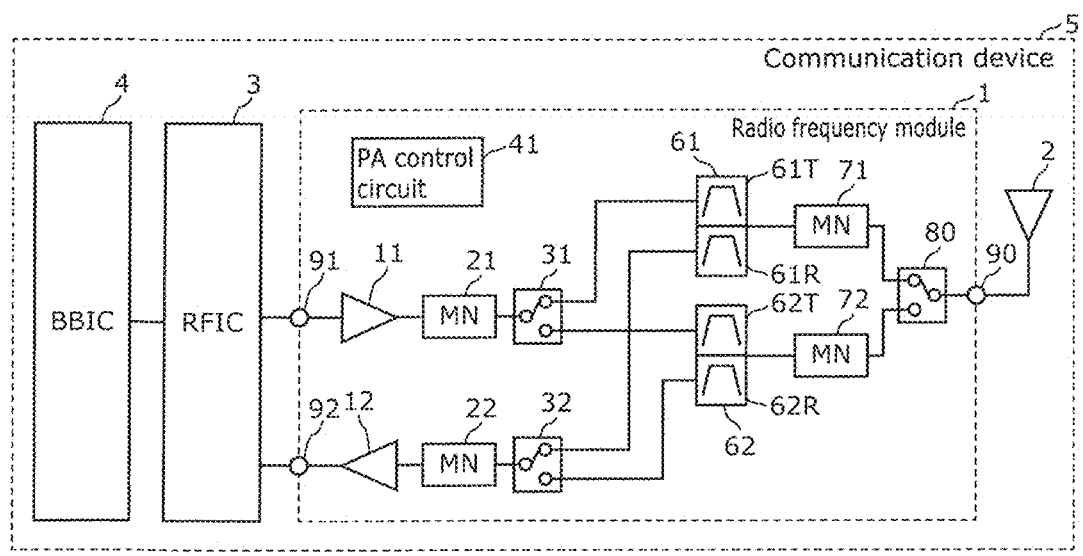
FIG. 1 is a diagram showing circuit structures of a radio frequency module and a communication device according to the embodiment.

The following describes in detail the embodiment and its variations according to the present disclosure with reference to the drawings. Note that the following embodiment and its variations show a comprehensive or specific example of the present disclosure. The numerical values, shapes, materials, structural elements, the arrangement and connection of the structural elements, etc. shown in the following embodiment and its variations are mere examples, and thus are not intended to limit the present disclosure. Of the structural elements described in the following embodiment and its variations, structural elements not recited in any one of the independent claims that indicate the broadest concepts of the present disclosure will be described as optional structural elements.

Note that the drawings are schematic diagrams in which emphasis, omission, or ratio adjustment has been applied where necessary to illustrate the present disclosure. The drawings are thus not necessarily exact illustration of the present disclosure, and may illustrate shapes, positional relationships, and ratios differently from the actual ones. In the drawings, substantially the same structural elements are assigned the same reference marks, and their repetitive description may be omitted or simplified.

In the drawings, the X axis and the Y axis are orthogonal to each other on a plane that is parallel to a principal surface of the mounting board. Also, the Z axis is normal to a principal surface of the module substrate. The positive direction and the negative direction of the Z axis indicate the upward direction and the downward direction, respectively.

In the present disclosure, "connected" means not only the case where elements are directly connected via a connection terminal and/or a wiring conductor, but also the case where elements are electrically connected via another circuit element.

Also in the present disclosure, terms that represent the relation between elements (e.g., "parallel" and "vertical"), terms that represent the shape of an element (e.g., "rectangular"), and a range of numerical values indicate not only the exact meanings of the terms, but also substantially equivalent scopes of the terms. For example, such terms include the meaning of a few percent of error.

Also in the present disclosure, "plan view" means a view of an object, from the Z direction, that is orthographically projected onto the XY plane.

Embodiment

The following describes the embodiment with reference to FIG. 1 through FIG. 5B.

[1.1 Circuit Structures of Radio Frequency Module 1 and Communication Device 5]

With reference to FIG. 1, the circuit structures of radio frequency module 1 and communication device 5 according to the present embodiment will be specifically described.

FIG. 1 is a diagram showing the circuit structures of radio frequency module 1 and communication device 5 according to the embodiment. As shown in FIG. 1, communication device 5 includes radio frequency module 1, antenna 2, RFIC 3, and BBIC 4.

Radio frequency module 1 transfers a radio frequency signal between antenna 2 and RFIC 3. A detailed circuit structure of radio frequency module 1 will be described later.

Antenna 2 is connected to antenna connection terminal 90 of radio frequency module 1. Antenna 2 radiates a transmission signal outputted from radio frequency module 1. Antenna 2 also receives a reception signal from outside and outputs the received reception signal to radio frequency module 1.

RFIC 3 is an example of the signal processing circuit that processes a radio frequency signal transmitted/received by antenna 2. More specifically, RFIC 3 performs signal processing, such as down-conversion, on a radio frequency reception signal inputted via a reception signal path of radio frequency module 1, and outputs the resulting reception signal to BBIC 4. RFIC 3 also performs signal processing, such as up-conversion, on a transmission signal inputted from BBIC 4, and outputs the resulting radio frequency transmission signal to a transmission signal path of radio frequency module 1.

BBIC 4 is a baseband signal processing circuit that performs signal processing by use of an intermediate frequency band, the frequency of which is lower than that of a radio frequency signal transferred by radio frequency module 1. The signal processed by BBIC 4 is used, for example, as an image signal for image display, or as a sound signal for telephone conversation through a speaker.

RFIC 3 controls connections of switches 31, 32, and 80 included in radio frequency module 1 on the basis of a communication band to be used. RFIC 3 also transfers, to PA control circuit 41, a control signal for adjusting the gain, etc. of power amplifier 11 of radio frequency module 1.

Note that communication device 5 according to the present embodiment may not include antenna 2 and BBIC 4. Stated differently, antenna 2 and BBIC 4 are not essential structural elements of the communication device according to the present disclosure.

[1.2 Circuit Structure of Radio Frequency Module 1]

The following describes a detailed structure of radio frequency module 1.

As shown in FIG. 1, radio frequency module 1 includes power amplifier 11, low-noise amplifier 12, matching circuits 21, 22, 71, and 72, switches 31, 32, and 80, duplexers 61 and 62, PA control circuit 41, antenna connection terminal 90, transmission input terminal 91, and reception output terminal 92.

Power amplifier 11 amplifies radio frequency transmission signals inputted from transmission input terminal 91. More specifically, power amplifier 11 amplifies radio frequency transmission signals in communication band A (first communication band) and communication band B (second communication band).

Low-noise amplifier 12 amplifies radio frequency reception signals and outputs the resulting signals to reception output terminal 92. More specifically, low-noise amplifier 12 performs low-noise amplification on radio frequency reception signals in communication band A and communication band B.

Duplexer 61 passes radio frequency signals in communication band A. Duplexer 61 includes transmission filter 61T and reception filter 61R. Duplexer 61 transfers a transmission signal and a reception signal in communication band A by the Frequency Division Duplex (FDD) method.

Transmission filter 61T is disposed on the transmission path that connects power amplifier 11 and antenna connection terminal 90. Transmission filter 61T passes a transmission signal in the transmission frequencies of communication band A among transmission signals amplified by power amplifier 11.

Reception filter 61R is disposed on the reception path that connects low-noise amplifier 12 and antenna connection terminal 90. Reception filter 61R passes a reception signal in the reception frequencies of communication band A among reception signals inputted from antenna connection terminal 90.

Duplexer 62 passes radio frequency signals in communication band B. Duplexer 62 includes transmission filter 62T and reception filter 62R. Duplexer 62 transfers a transmission signal and a reception signal in communication band B by the FDD method.

Transmission filter 62T is disposed on the transmission path that connects power amplifier 11 and antenna connection terminal 90. Transmission filter 62T passes a transmission signal in the transmission frequencies of communication band B among transmission signals amplified by power amplifier 11.

Reception filter 62R is disposed on the reception path that connects low-noise amplifier 12 and antenna connection terminal 90. Reception filter 62R passes a reception signal in the reception frequencies of communication band B among reception signals inputted from antenna connection terminal 90.

Non-limiting examples of the above transmission filters 61T and 62T, and reception filters 61R and 62R include an acoustic wave filter utilizing surface acoustic wave (SAW), an acoustic wave filter utilizing bulk acoustic wave (BAW), an LC resonant filter, and a dielectric filter, or may be any combination of these filters.

Matching circuit 21 is disposed on the transmission path that connects power amplifier 11 and transmission filters 61T and 62T, and connected to the output terminal of power amplifier 11. Matching circuit 21 matches the impedance between power amplifier 11 and transmission filters 61T and 62T.

Matching circuit 22 is disposed on the reception path that connects low-noise amplifier 12 and reception filters 61R and 62R, and connected to the input terminal of low-noise amplifier 12. Matching circuit 22 matches the impedance between low-noise amplifier 12 and reception filters 61R and 62R.

Switch 31 includes a common terminal and two selection terminals. The common terminal of switch 31 is connected to power amplifier 11 via matching circuit 21. One of the selection terminals of switch 31 is connected to transmission filter 61T, and the other of the selection terminals of switch 31 is connected to transmission filter 62T. Having such connection structure, switch 31 switches a connection between the common terminal and one of the selection terminals, and a connection between the common terminal and the other of the selection terminals. Stated differently, switch 31 switches a connection between power amplifier 11 and transmission filter 61T, and a connection between power amplifier 11 and transmission filter 62T. Switch 31 is implemented, for example, as a single pole double throw (SPDT) switch circuit.

Switch 32 includes a common terminal and two selection terminals. The common terminal of switch 32 is connected to low-noise amplifier 12 via matching circuit 22. One of the selection terminals of switch 32 is connected to reception filter 61R, and the other of the selection terminals of switch 32 is connected to reception filter 62R. Having such connection structure, switch 32 switches a connection/disconnection between the common terminal and one of the selection terminals, and a connection/disconnection between the common terminal and the other of the selection terminals. Stated differently, switch 32 switches a connection/disconnection between low-noise amplifier 12 and reception filter 61R, and a connection/disconnection between low-noise amplifier 12 and reception filter 62R. Switch 32 is implemented, for example, as a SPDT switch circuit.

Switch 80 includes a common terminal and two selection terminals. The common terminal of switch 80 is connected to antenna connection terminal 90. One of the selection terminals of switch 80 is connected to duplexer 61 via matching circuit 71, and the other of the selection terminals of switch 80 is connected to duplexer 62 via matching circuit 72. Having such connection structure, switch 80 switches a connection/disconnection between the common terminal and one of the selection terminals, and a connection/disconnection between the common terminal and the other of the selection terminals. Stated differently, switch 80 is an antenna switch that switches a connection/disconnection between antenna 2 and duplexer 61, and a connection/disconnection between antenna 2 and duplexer 62. Switch 80 is implemented, for example, as a multi-connection switch circuit.

Matching circuit 71 is disposed on the path that connects switch 80 and duplexer 61. Matching circuit 71 matches the impedance between duplexer 61 and switch 80 connected to antenna 2.

Matching circuit 72 is disposed on the path that connects switch 80 and duplexer 62. Matching circuit 72 matches the impedance between duplexer 62 and switch 80 connected to antenna 2.

PA control circuit 41 is a power amplifier controller that controls power amplifier 11. PA control circuit 41 outputs a control signal to power amplifier 11 in response to a control signal from RFIC 3.

Note that radio frequency module 1 may not include one or more of the circuit elements shown in FIG. 1. Radio frequency module 1 is simply required to include at least power amplifier 11.

[2. Disposition of Circuit Elements of Radio Frequency Module 1]

Figure 2A:
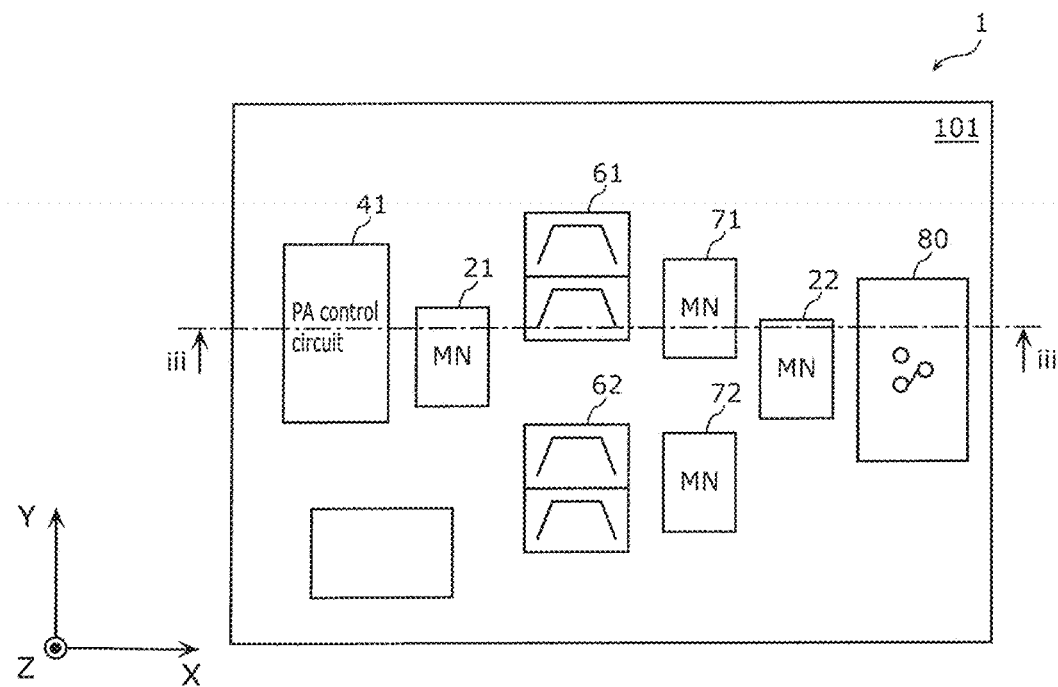
FIG. 2A is a plan view of the radio frequency module according to the embodiment.
Figure 2B:
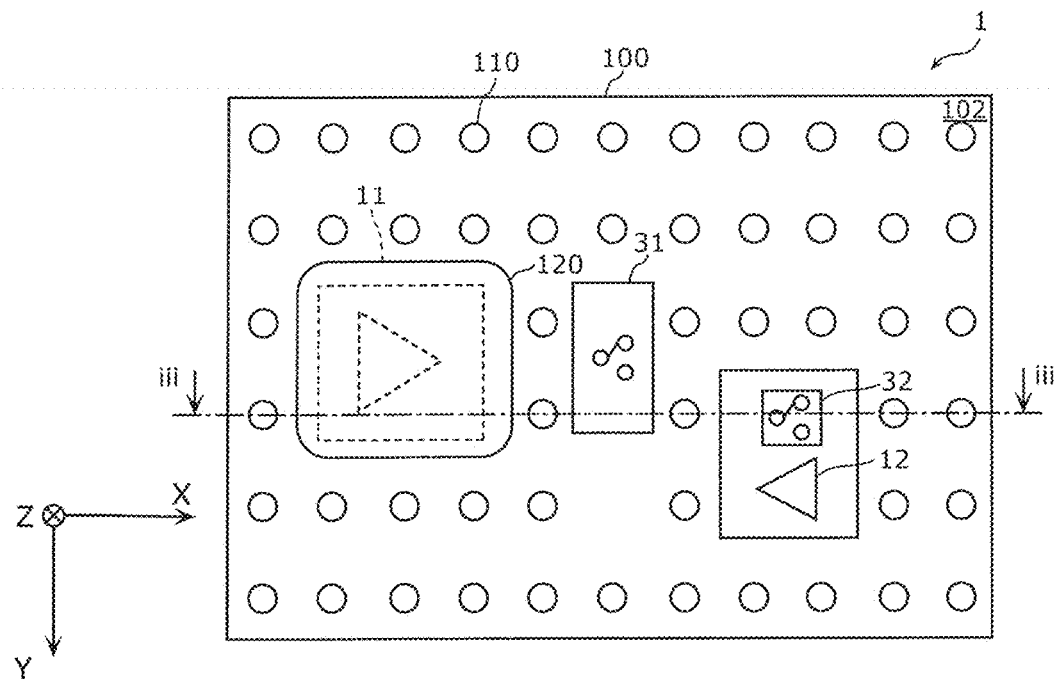
FIG. 2B is a bottom view of the radio frequency module according to the embodiment.
Figure 3:
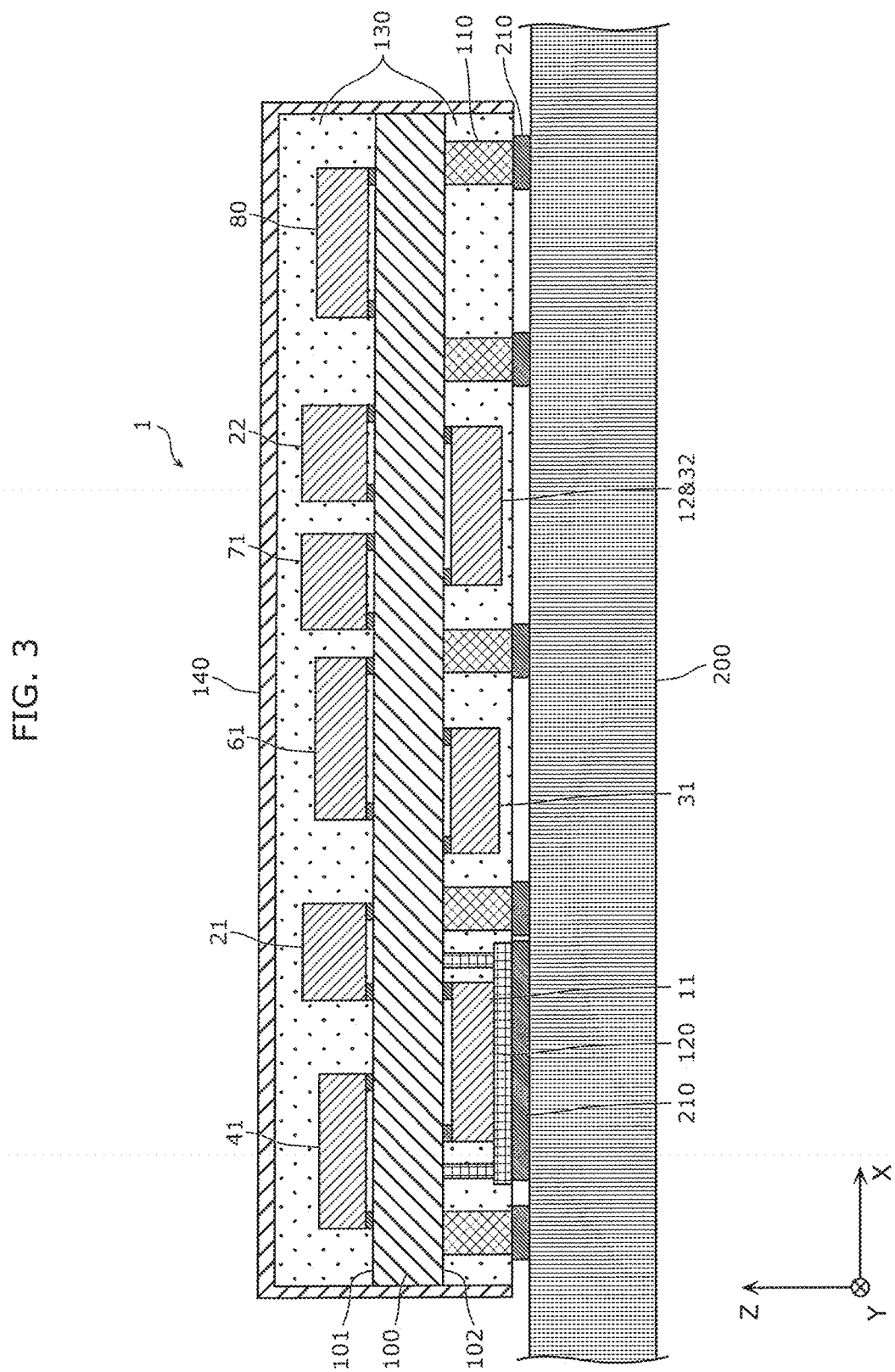
FIG. 3 is a cross-sectional view of the radio frequency module according to the embodiment amounted on a mother board.

With reference to FIG. 2A through FIG. 3, the following specifically describes the disposition of the circuit elements of radio frequency module 1 with the above structure.

FIG. 2A is a plan view of radio frequency module 1 according to the embodiment. FIG. 2B is a bottom view of radio frequency module 1 according to the embodiment. FIG. 3 is a cross-sectional view of radio frequency module 1 according to the embodiment mounted on mother board 200. FIG. 3 shows a cross-section of radio frequency module 1 cult along iii-iii line shown in FIG. 2A and FIG. 2B.

As shown in FIG. 2A through FIG. 3, in addition to the circuit elements shown in FIG. 1, radio frequency module 1 further includes module substrate 100, a plurality of post electrodes 110, heat dissipator 120, resin members 130, shield electrode layer 140, and other circuit elements (without reference marks). Note that FIG. 2A and FIG. 2B omit the illustration of resin members 130 and shield electrode layer 140.

Module substrate 100 includes principal surface 102 on which post electrodes 110 are disposed, and principal surface 101 on the opposite side of principal surface 102. Non-limiting examples of module substrate 100 include a printed circuit board (PCB), a low temperature co-fired ceramics (LTCC) substrate, and a multilayered resin substrate.

Principal surface 101, which is an example of the second principal surface, is also referred to as an upper surface or a surface. As shown in FIG. 2A, mounted on principal surface 101 according to the present embodiment are matching circuits 21, 22, 71, and 72, PA control circuit 41, duplexers 61 and 62, and switch 80.

Principal surface 102, which is an example of the first principal surface, is also referred to as a lower surface or a back surface. As shown in FIG. 2B, mounted on principal surface 102 according to the present embodiment are power amplifier 11, low-noise amplifier 12, and switches 31 and 32.

In the present embodiment, in a plan view of module substrate 100, part of power amplifier 11 overlaps part of PA control circuit 41 and part of matching circuit 21. Stated differently, in a plan view of module substrate 100, part of PA control circuit 41 and part of matching circuit 21 are disposed in that region on principal surface 101 which overlaps power amplifier 11.

Note that the dispositions of PA control circuit 41 and matching circuit 21 are not limited to the above examples. PA control circuit 41 and matching circuit 21 may be disposed, for example, on principal surface 102.

A plurality of post electrodes 110 are an example of the external-connection terminals. Each of post electrodes 110 is disposed on and extends from principal surface 102 of module substrate 100. Also, each of post electrodes 110 penetrates resin member 130, and one of its ends is exposed from resin member 130. The ends of post electrodes 110 being exposed from resin member 130 are connected, via solder 210, to an input and output terminal, a ground electrode, and so forth on mother board 200 that is disposed in the negative direction of the Z axis of radio frequency module 1.

Heat dissipator 120 covers that surface of power amplifier 11 which is opposite to the surface that faces module substrate 100. Stated differently, heat dissipator 120 covers the lower surface of power amplifier 11 shown in FIG. 3. Heat dissipator 120 is partially exposed from resin member 130, and such exposed portion is connected to an electrode on mother board 200 via solder 210. This structure enables heat dissipator 120 to effectively convey heat generated in power amplifier 11 to mother board 200. A detailed structure of heat dissipator 120 will be described later.

Resin members 130 are disposed on principal surfaces 101 and 102 of module substrate 100, and cover the circuit elements on principal surfaces 101 and 102. Resin members 130 are capable of ensuring the reliability of the circuit elements disposed on principal surfaces 101 and 102, such as their mechanical strength and humidity resistance.

Resin members 130, post electrodes 110, and heat dissipator 120 are made flat, for example, by shaving the lower surface of radio frequency module 1, and post electrodes 110 and heat dissipator 120 are exposed from resin member 130.

Shield electrode layer 140 is formed to cover the upper and side surfaces of resin members 130, and set at the ground potential. Shield electrode layer 140 is capable of preventing the entry of exogenous noise into the circuit elements included in radio frequency module 1.

Note that radio frequency module 1 may not include resin members 130 and shield electrode layer 140. Stated differently, resin members 130 and shield electrode layer 140 are not essential structural elements of the radio frequency module according to the present disclosure.

[3. Structure of Heat Dissipator 120]

Figure 4:
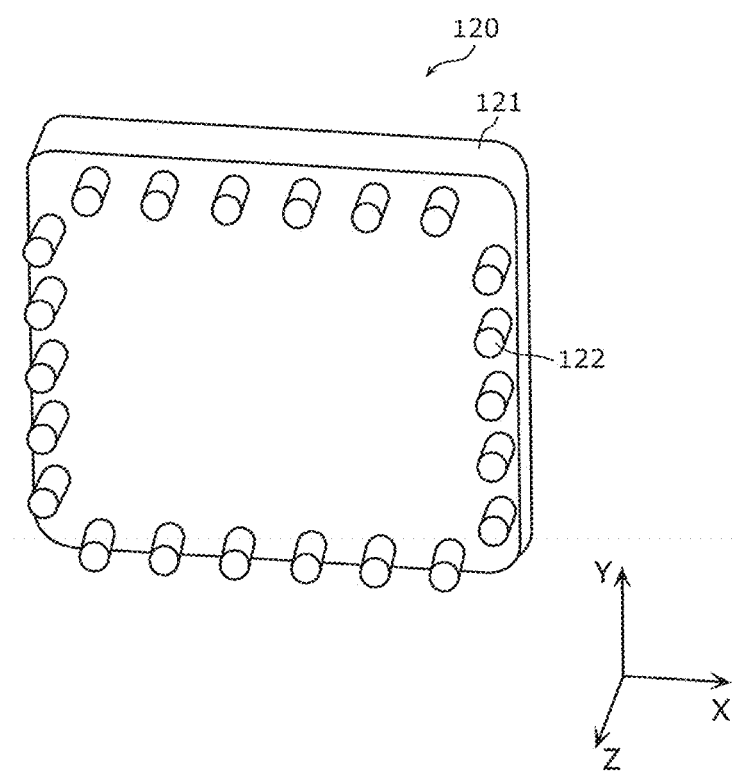
FIG. 4 is a perspective view of a heat dissipator according to the embodiment.
Figure 5A:
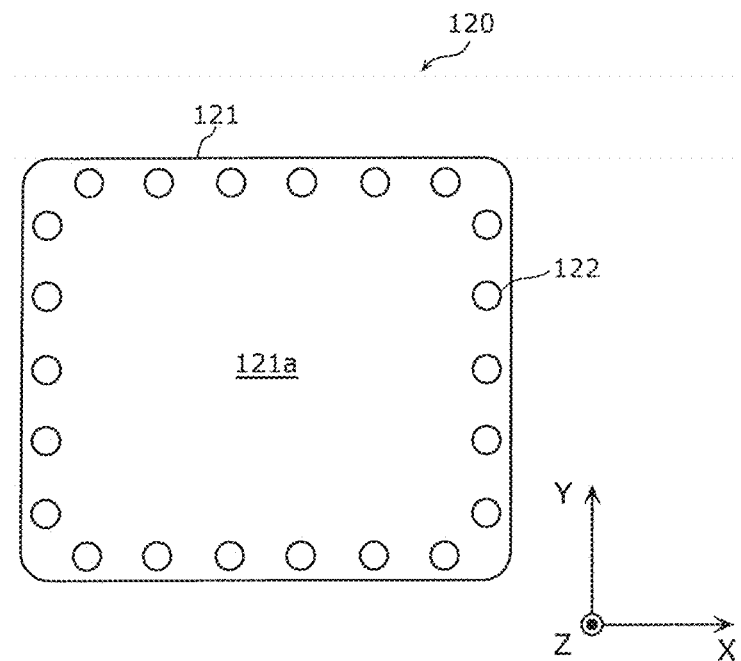
FIG. 5A is a plan view of the heat dissipator according to the embodiment.
Figure 5B:
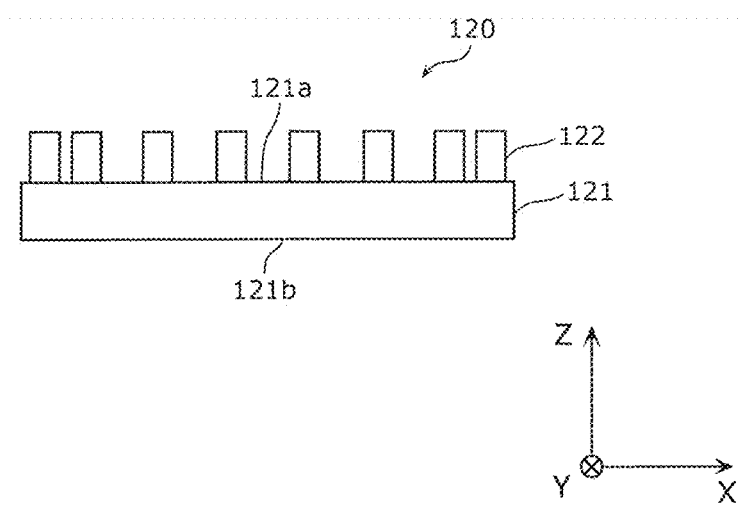
FIG. 5B is a front view of the heat dissipator according to the embodiment.

With reference to FIG. 3 through FIG. 5B, the following describes the structure of heat dissipator 120. FIG. 4 is a perspective view of heat dissipator 120 according to the embodiment. FIG. 5A is a plan view of heat dissipator 120 according to the embodiment. FIG. 5B is a front view of heat dissipator 120 according to the embodiment.

As shown in FIG. 4 and other drawings, heat dissipator 120 includes heat dissipation portion 121 and a plurality of columnar portions 122. Heat dissipation portion 121 is a plate member having a rounded rectangular shape. Heat dissipation portion 121 has higher heat conductivity than that of resin member 130, and thus is easier than resin member 130 to transfer heat of power amplifier 11. Non-limiting example materials of heat dissipation portion 121 include metal (e.g., copper). Heat dissipation portion 121 includes surface 121a at the side of module substrate 100, and surface 121b at the side of mother board 200.

As shown in FIG. 3, heat dissipation portion 121 covers that surface of power amplifier 11 which is opposite to the surface that faces module substrate 100. Surface 121a of heat dissipation portion 121 according to the present embodiment contacts that surface of power amplifier 11 which is opposite to the surface that faces module substrate 100.

As shown in FIG. 4 and other drawings, a plurality of columnar portions 122 is an example of the leg portion that extends from heat dissipation portion 121 toward principal surface 102 of module substrate 100. Each of columnar portions 122 has a circular cylindrical shape, and extends from heat dissipation portion 121 toward module substrate 100. A plurality of columnar portions 122 are arranged spaced apart from each other, along the periphery of surface 121a of heat dissipation portion 121. When heat dissipation portion 121 is attached to power amplifier 11, a plurality of columnar portions 122 are arranged along sides of power amplifier 11, with their tips contacting principal surface 102.

Note that the leg portion of heat dissipator 120 is not limited to being formed as columnar portions 122. Also, the tips of columnar portions 122 contact principal surface 102, but they are not limited to this example. Variations of the leg portion will be described later.

[4. Effects, Etc.]

As described above, radio frequency module 1 according to the present embodiment includes module substrate 100 including principal surface 102 on which external-connection terminals (a plurality of post electrodes 100) are disposed; power amplifier 11 disposed on principal surface 102 of module substrate 100 and amplifies a radio frequency transmission signal; and heat dissipator 120 that dissipates heat of power amplifier 11. Heat dissipator 120 includes: heat dissipation portion 121 covering a surface of power amplifier 11 which is opposite to a surface that faces module substrate 100; and a leg portion (a plurality of columnar portions 122) extending from heat dissipation portion 121 toward principal surface 102 of module substrate 100.

With this structure, heat dissipator 120 is capable of improving the heat radiation of power amplifier 11 even under a condition that power amplifier 11 is disposed on principal surface 102 of module substrate 100 on which the external-connection terminals are disposed. For example, heat dissipation portion 121 of heat dissipator 120, when connected to mother board 200 to which the external-connection terminals are connected, effectively conveys heat to mother board 200 from that surface of power amplifier 11 which is opposite to the surface that faces module substrate 100. This thus improves the heat dissipation of power amplifier 11. Furthermore, the leg portion that extends from heat dissipation portion 121 toward principal surface 102 of module substrate 100 prevents the entry and exit of noise into and from power amplifier 11.

Also, in radio frequency module 1 according to the present embodiment, a tip of the leg portion (a plurality of columnar portions 122) may contact, for example, principal surface 102.

This structure enables heat dissipator 120 to be reliably fixed to power amplifier 11, thus preventing heat dissipator 120 from being detached from power amplifier 11. This consequently prevents the degradation in the heat dissipation of power amplifier 11.

Also, in radio frequency module 1 according to the present embodiment may further include, for example, resin member 130 disposed on principal surface 102 of module substrate 100 and covering power amplifier 11. Here, heat dissipation portion 121 may be exposed from resin member 130 at least partially.

With this structure, at least part of heat dissipation portion 121 is exposed from resin member 130. This structure enables resin member 130 to ensure the reliability of power amplifier 11 such as mechanical strength and humidity resistance, as well as enabling heat dissipator 120 to improve the heat dissipation of power amplifier 11. In particular, a portion of heat dissipation portion 121 that is exposed from resin member 130, when connected to mother board 200, enables heat to be effectively conveyed from power amplifier 11 to mother board 200 via heat dissipation portion 121.

Also, in radio frequency module 1 according to the present embodiment, the leg portion may include, for example, a plurality of columnar portions 122 that are disposed spaced apart from each other.

This structure enables resin member 130 to enter between a plurality of columnar portions 122 that are arranged spaced apart from each other and thus easily cover power amplifier 11. This improves the productivity of radio frequency module 1.

Also, in radio frequency module 1 according to the present embodiment, a plurality of columnar portions 122 may be arranged, for example, along a side of power amplifier 11.

This structure enables a plurality of columnar portions 122 to prevent signal interference between power amplifier 11 and another circuit element, thus achieving the downsizing of radio frequency module 1.

Also, in radio frequency module 1 according to the present embodiment, heat dissipation portion 121 may contact, for example, the surface of power amplifier 11 which is opposite to the surface that faces module substrate 100.

This structure enables heat dissipation portion 121 to contact that surface of power amplifier 11 which is opposite to the surface that faces module substrate 100. The surface of power amplifier 11 which is opposite to the surface that faces module substrate 100 is close to mother board 200. As such, the above structure enables heat to be conveyed through a shorter path from power amplifier 11 to mother board 200. This thus enables heat to be more effectively conveyed from power amplifier 11 to mother board 200.

Also, in radio frequency module 1 according to the present embodiment, heat dissipation portion 121 may comprise, for example, metal.

This structure readily achieves higher heat conductivity of heat dissipation portion 121, thus improving the heat dissipation of power amplifier 11.

Also, radio frequency module 1 according to the present embodiment may further include, for example, PA control circuit 41 disposed on principal surface 101 of module substrate 100 and controls power amplifier 11. Here, principal surface 101 is at an opposite side of principal surface 102. Also, in a plan view of module substrate 100, at least part of PA control circuit 41 may overlap at least part of power amplifier 11.

This structure, in which heat dissipator 120 improves the heat dissipation of power amplifier 11, does not require a region on principal surface 101 for an object that dissipates the heat of power amplifier 11. This structure thus enables a circuit element to be disposed in a region, on principal surface 101, that overlaps power amplifier 11, in a plan view of module substrate 100. This thus enables an effective use of the region that overlaps power amplifier 11 as well as achieving the downsizing of radio frequency module 1. In particular, by disposing PA control circuit 41 in the region that overlaps power amplifier 11, the length of wiring between power amplifier 11 and PA control circuit 41 is reduced, as a result of which the downsizing of radio frequency module 1 is achieved.

Also, radio frequency module 1 according to the present embodiment may further include, for example, matching circuit 21 disposed on principal surface 101 of module substrate 100 and connected to power amplifier 11. Here, principal surface 101 is at an opposite side of principal surface 102. Also, in a plan view of module substrate 100, at least part of matching circuit 21 may overlap at least part of power amplifier 11.

This structure, in which heat dissipator 120 improves the heat dissipation of power amplifier 11, does not require a region on principal surface 101 for an object that dissipates the heat of power amplifier 11. This structure thus enables a circuit element to be disposed in a region, on principal surface 101, that overlaps power amplifier 11, in a plan view of module substrate 100. This thus enables an effective use of the region that overlaps power amplifier 11 as well as achieving the downsizing of radio frequency module 1. In particular, by disposing matching circuit 21 in the region that overlaps power amplifier 11, the length of wiring between power amplifier 11 and matching circuit 21 is reduced, as a result of which the downsizing of radio frequency module 1 is achieved.

Also, communication device 5 according to the present embodiment includes: antenna 2; RFIC 3 that processes a radio frequency transmission signal transmitted by antenna 2; and radio frequency module 1 that transfers the radio frequency transmission signal between antenna 2 and RFIC 3.

This structure enables communication device 5 to achieve the similar effects as those achieved by radio frequency module 1 described above.

Variations

The radio frequency module and the communication device according to the present disclosure have been described above, using the embodiment as an example, but the radio frequency module and the communication device according to the present disclosure are not limited to such embodiment. The present disclosure also includes variations achieved by making various modifications to the embodiment that can be conceived by those skilled in the art without departing from the essence of the present disclosure, and various devices that include the radio frequency module and the communication device described above.

For example, in radio frequency module 1 and communication device 5 according to the embodiment, another circuit element, wiring, and so forth may be present in a path that connects each circuit element and a signal path disclosed in the drawings. A multiplexer, for example, may be disposed between antenna 2 and switch 80 according to the embodiment.

Figure 6:
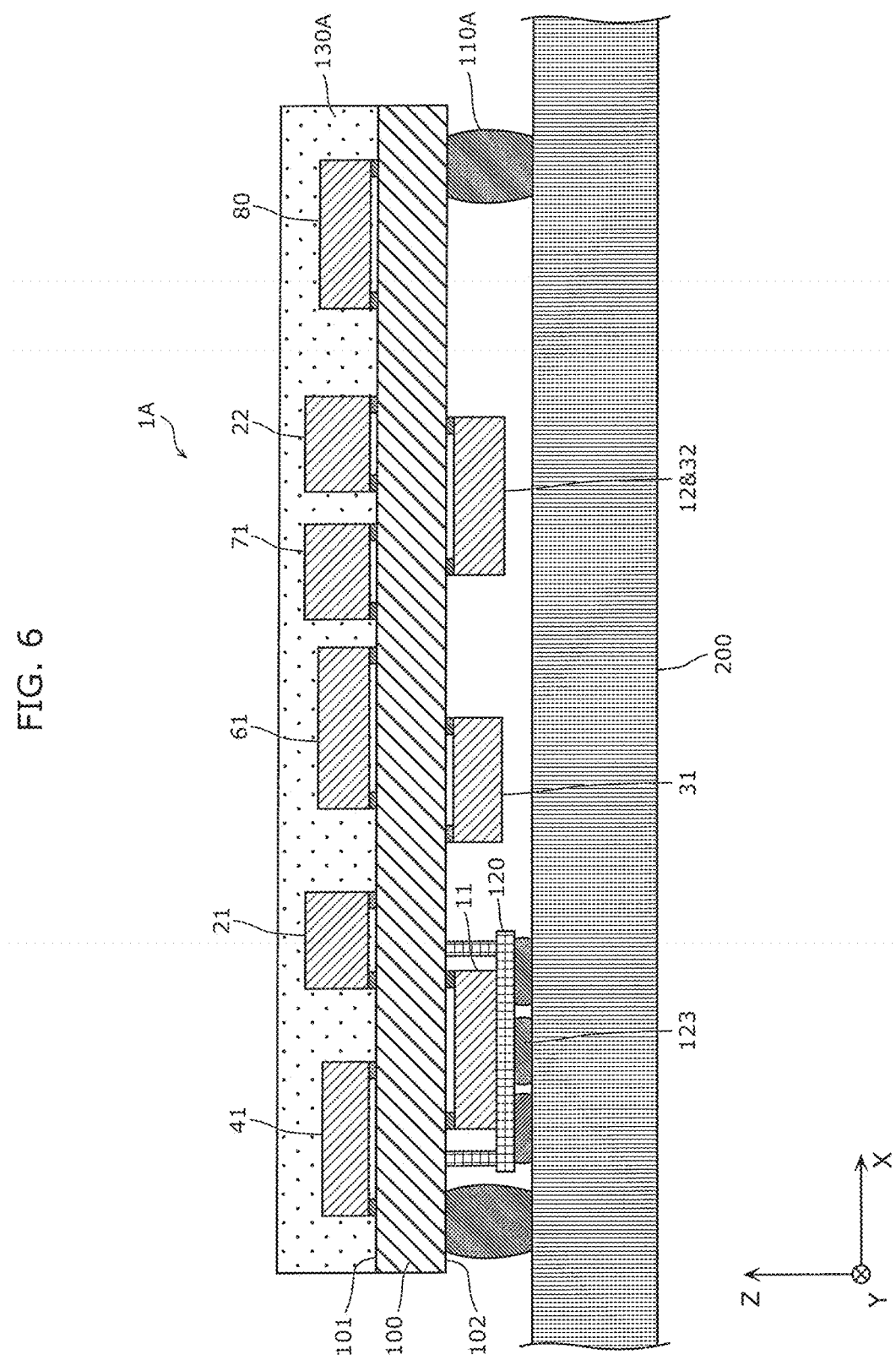
FIG. 6 is a cross-sectional view of a radio frequency module according to a variation of the embodiment.

Also, radio frequency module 1 according to the embodiment includes post electrodes 110 as its external-connection terminals, but the external-connection terminals are not limited to this example. As shown in FIG. 6, instead of post electrodes 110, radio frequency module 1A may include bump electrodes 110A as its external-connection terminals. In this case, resin member 130A covers the circuit elements on principal surface 101 of module substrate 100, and may not cover the circuit elements on principal surface 102. Also, heat dissipator 120 may be connected to mother board 200 via bump 123.

Figure 7A:
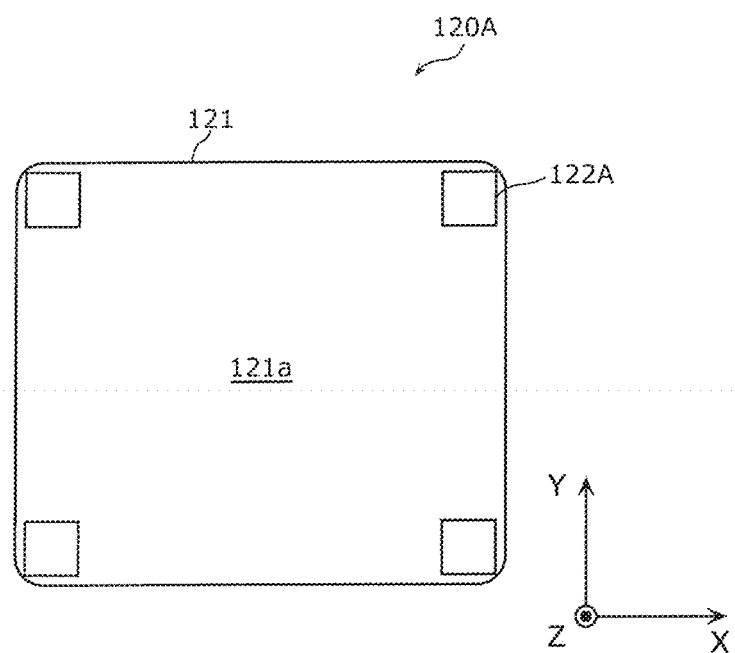
FIG. 7A is a plan view of a heat dissipator according to a variation of the embodiment.
Figure 7B:
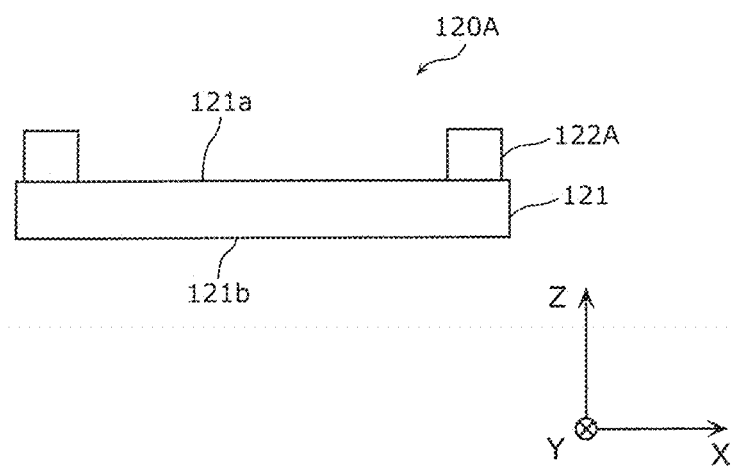
FIG. 7B is a front view of the heat dissipator according to the above variation of the embodiment.

Also, heat dissipator 120 according to the embodiment includes 22 columnar portions 122 having a circular cylindrical shape as its leg portion, but the leg portion of heat dissipator 120 is not limited to this example. The leg portion of heat dissipator 120 is not required to be in a circular cylindrical shape. Also, the number of the columnar portions may be greater or smaller than 22. As shown in FIG. 7A and FIG. 7B, for example, heat dissipator 120A may include, as a variation of the leg portion, four columnar portions 122A having a quadrangular prism shape.

Figure 8A:
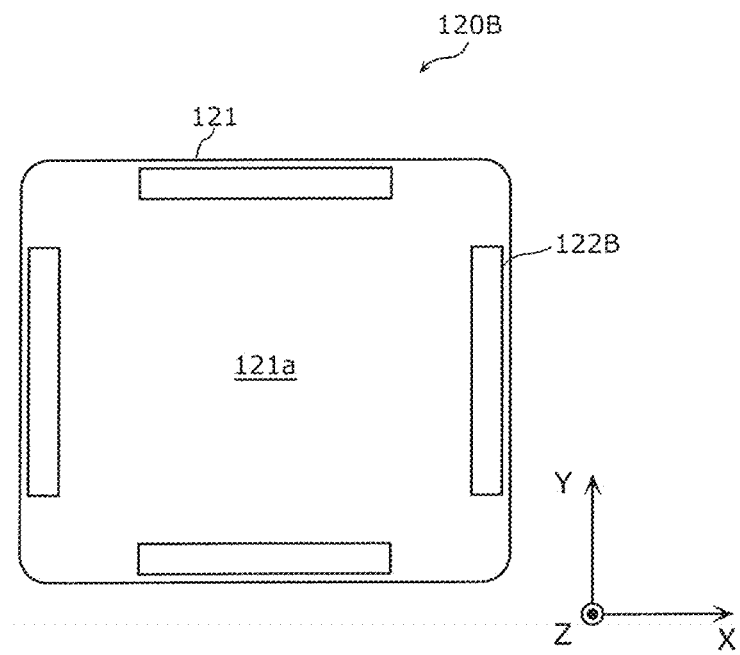
FIG. 8A is a plan view of a heat dissipator according to a variation of the embodiment.
Figure 8B:
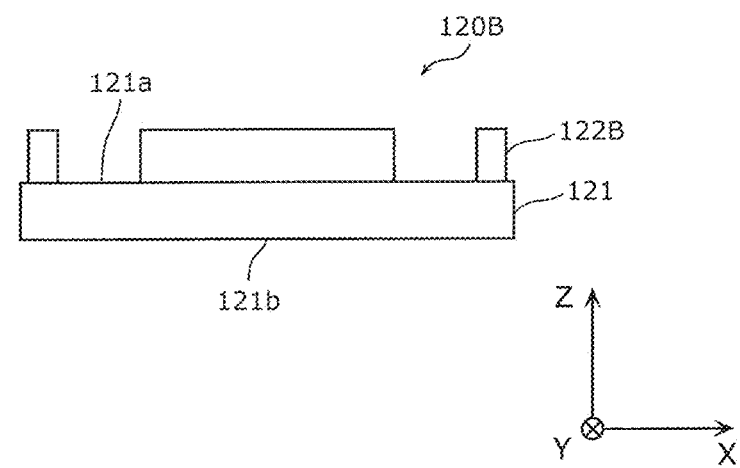
FIG. 8B is a front view of the heat dissipator according to the above variation of the embodiment.

Also, the leg portion of heat dissipator 120 may not have a columnar shape. As shown in FIG. 8A and FIG. 8B, for example, heat dissipator 120B may include, as a variation of the leg portion, four wall portions 122B that extend from heat dissipation portion 121 toward principal surface 102 of module substrate 100.

In the case of having the structure as shown in FIG. 7A and FIG. 7B, or FIG. 8A and FIG. 8B, too, the leg portion that extends from heat dissipation portion 121 toward principal surface 102 of module substrate 100 prevents the entry and exist of noise into and from power amplifier 11. Further, this structure enables resin member 130 to enter between columnar portions and thus easily cover power amplifier 11. This improves the productivity of radio frequency module 1.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure is widely applicable for use in a communication device (e.g., mobile phone) as a radio frequency module that is placed at the front-end portion in wireless communication.

The invention claimed is:

1. A radio frequency module, comprising:
   a substrate including a first principal surface on which external-connection terminals are disposed;
   a power amplifier disposed on the first principal surface, and configured to amplify a radio frequency transmission signal; and
   a heat dissipator configured to dissipate heat of the power amplifier, wherein the heat dissipator includes
      a heat dissipation plate covering a surface of the power amplifier which is opposite to a surface that faces the substrate; and
      at least a first leg extending from the heat dissipation plate toward the first principal surface.

2. The radio frequency module of claim 1, wherein a tip of the at least the first leg contacts the first principal surface.

3. The radio frequency module of claim 1, further comprising:
   a resin member disposed on the first principal surface and covering the power amplifier.

4. The radio frequency module of claim 3, wherein the heat dissipation plate is at least partially exposed from the resin member.

5. The radio frequency module of claim 1, wherein the at least the first leg includes a plurality of columnar portions that are disposed spaced apart from each other.

6. The radio frequency module of claim 5, wherein the plurality of columnar portions are arranged along a side of the power amplifier.

7. The radio frequency module of claim 1, wherein the heat dissipation plate contacts the surface of the power amplifier which is opposite to the surface that faces the substrate.

8. The radio frequency module of claim 1, wherein the heat dissipation plate comprises metal.

9. The radio frequency module of claim 1, further comprising:
   a control circuit disposed on a second principal surface of the substrate and configured to control the power amplifier, the second principal surface being at an opposite side of the first principal surface.

10. The radio frequency module of claim 9, wherein in a plan view of the substrate, at least part of the control circuit overlaps at least part of the power amplifier.

11. The radio frequency module of claim 1, further comprising:
    a matching circuit disposed on a second principal surface of the substrate and connected to the power amplifier, the second principal surface being at an opposite side of the first principal surface.

12. The radio frequency module of claim 11, wherein in a plan view of the substrate, at least part of the matching circuit overlaps at least part of the power amplifier.

13. The communication device of claim 1, further comprising:
    a control circuit disposed on a second principal surface of the substrate and configured to control the power amplifier, the second principal surface being at an opposite side of the first principal surface, wherein
    in a plan view of the substrate, at least part of the control circuit overlaps at least part of the power amplifier.

14. A communication device, comprising:
    an antenna;
    a signal processing circuit configured to process a radio frequency transmission signal transmitted by the antenna; and
    a radio frequency module configured to transfer the radio frequency transmission signal between the antenna and the signal processing circuit, the radio frequency module comprising
       a substrate including a first principal surface on which external-connection terminals are disposed;
       a power amplifier disposed on the first principal surface, and configured to amplify a radio frequency transmission signal; and
       a heat dissipator configured to dissipate heat of the power amplifier, wherein the heat dissipator includes
       a heat dissipation plate covering a surface of the power amplifier which is opposite to a surface that faces the substrate; and
       at least a first leg extending from the heat dissipation plate toward the first principal surface.

15. The communication device of claim 14, wherein a tip of the at least the first leg contacts the first principal surface.

16. The communication device of claim 14, further comprising:
    a resin member disposed on the first principal surface and covering the power amplifier, wherein
    the heat dissipation plate is at least partially exposed from the resin member.

17. The communication device of claim 16, wherein the at least the first leg includes a plurality of columnar portions that are disposed spaced apart from each other, and
    the plurality of columnar portions are arranged along a side of the power amplifier.

18. The communication device of claim 14, wherein the heat dissipation plate contacts the surface of the power amplifier which is opposite to the surface that faces the substrate.

19. The communication device of claim 14, further comprising:
    a matching circuit disposed on a second principal surface of the substrate and connected to the power amplifier, the second principal surface being at an opposite side of the first principal surface, wherein
    in a plan view of the substrate, at least part of the matching circuit overlaps at least part of the power amplifier.

20. An electronic device, comprising:
    a substrate including a first principal surface;
    a power amplifier disposed on the first principal surface; and
    a heat dissipation plate covering a surface of the power amplifier which is opposite to a surface that faces the substrate; and
    at least a first leg extending from the heat dissipation plate toward the first principal surface.

* * * * *